United States Patent [19]

Chang et al.

[11] 4,235,650
[45] Nov. 25, 1980

[54] OPEN TUBE ALUMINUM DIFFUSION

[75] Inventors: Mike F. Chang, Liverpool; Alfred Roesch, Auburn, both of N.Y.

[73] Assignee: General Electric Company, Auburn, N.Y.

[21] Appl. No.: 939,669

[22] Filed: Sep. 5, 1978

[51] Int. Cl.³ .......................................... H01L 21/223
[52] U.S. Cl. .................................... 148/189; 148/187
[58] Field of Search ................................. 148/189, 187

[56] References Cited

U.S. PATENT DOCUMENTS

| | | | |
|---|---|---|---|
| 3,589,953 | 6/1971 | Traxler | 148/189 |
| 3,615,945 | 10/1971 | Yokozawa | 148/190 |
| 3,852,128 | 12/1974 | Kreuzer | 148/189 |
| 3,972,838 | 8/1976 | Yamashita et al. | 148/189 X |
| 3,997,379 | 12/1976 | Rosnowski | 148/189 |

Primary Examiner—G. Ozaki
Attorney, Agent, or Firm—Robert J. Mooney; Stephen B. Salai

[57] ABSTRACT

A method for forming a p-conductivity type layer in a semiconductor wafer using aluminum as a diffusion source and which can be carried out in an open diffusion tube is described. A variety of aluminum sources can be employed in an open tube. A stream of essentially oxygen-free inert gas provides transport for the dopant and prevents the entry of potentially contaminating ambient into the tube.

25 Claims, 3 Drawing Figures

DIFFUSION TIME VS DIFFUSION DEPTH

OPEN TUBE ALUMINUM DIFFUSION

This invention relates in general to the fabrication of semiconductor devices and, more particularly, to a method for forming a p-conductivity type region by diffusing aluminum into a semiconductor substrate in an open tube diffusion process.

The use of diffusion for forming doped semiconductor regions in intrinsic or previously doped wafers is ubiquitous in the industry. Many different diffusants are utilized to form p and n-type semiconductor regions. Among these, especially for the formation of p-type regions, is boron. Boron is in many respects satisfactory but is notably slow to diffuse into silicon, even at relatively high temperatures, as for example, 1250° C. as are commonly employed. Even higher temperatures would provide more rapid diffusion but are to be avoided if acceptable yields are desired since damaging of the wafers increases at higher temperatures.

Aluminum is known to be desirable as a diffusant insofar as high quality junctions may be formed therewith which are capable of withstanding high reverse voltages. Additionally, aluminum is a relatively rapid diffuser with respect to silicon and substantial time-savings over prior art methods may be obtained through its use.

Aluminum has been employed in closed tube diffusion processes with some success. Closed tube diffusion is to be avoided in applications where low cost is especially important. The expense of opening a sealed tube after each diffusion operation as well as that of sealing and evacuating the tube prior to diffusion is generally substantially greater than for open tube diffusion. Additionally, closed tube aluminum diffusion has been limited in providing only relatively low surface impurity concentrations, on the order of $10^{16}$ atoms/cm$^3$, or the like. In many applications, these concentrations are unacceptably low and, therefore, aluminum diffusion has not been heretofore used as a manufacturing process.

As early as 1956, it was recognized (e.g., Miller and Savage, "Diffusion of Aluminum in Single Crystal Silicon", *Journal of Applied Physics*, Vol. 27, No. 12) that aluminum appears to be the fastest diffuser in silicon among the Group III and Group V elements. It was further observed that aluminum reacts with quartz during the diffusion process, resulting in lower partial pressure of aluminum in the diffusion tube and, therefore, lower ultimate impurity concentrations in the wafers which are diffused. It was suggested that higher concentrations might be obtained through the use of sealed silicon inner envelopes within an outer tantalum diffusion tube which was further enclosed with a quartz tube in a diffusion furnace. This multitube method was apparently successful in providing relatively high impurity concentrations in a closed tube diffusion process utilizing aluminum. It was, however, quite expensive due to the complex apparatus required. Since that time, it has been recognized from time to time that aluminum diffusion may be carried out in a closed tube with some success (see, for example, U.S. Pat. Nos. 3,341,377; 3,914,138; 4,038,111). These patents relate to the diffusion of aluminum in open and closed tubes. They are all concerned, however, only with diffusion from a source painted directly on or otherwise applied to the surface of the wafer to be diffused. The application of aluminum directly to the surface of the wafer to be diffused appears to have been required by the fact that aluminum oxidizes readily into stable oxides which are not easily broken down to provide elemental aluminum as a diffusant. Surface concentrations of about $10^{16}$ or $10^{17}$ appear to have been achieved but there is no apparent solution to the interdependent problems of providing high surface concentration and low cost diffusion, preferably, in an open tube Accordingly, it is an object of this invention to provide a method for diffusing aluminum into a silicon wafer in an open diffusion furnace.

It is another object of this invention to provide a process for the open tube diffusion of aluminum which yields surface concentrations on the order of $10^{19}$ atoms/cc.

It is yet another object of this invention to provide a process for the open tube diffusion of aluminum which does not require a aluminum to be applied directly to the surface of the wafer to be diffused.

It is a further object of this invention to provide an open tube aluminum diffusion process which may be carried out at a temperature somewhat lower than has been heretofore practical so as to provide higher yields.

It is a still further object of this invention to provide a process for the open tube diffusion of aluminum wherein a reuseable diffusant source is employed.

These and other objects of the instant invention are achieved in an open tube aluminum diffusion process wherein wafers to be diffused (hereinafter, target wafers) are inserted into a diffusion furnace along with a source of aluminum which is physically remote from the target wafers, that is to say, not applied to the surface thereof. Several alternative "remote sources" may be employed, among these are elemental aluminum disposed for example, in an inert crucible or the like; aluminum alloy wafers interleaved with target wafers; aluminum coated wafers interleaved with target wafers; and aluminum doped wafers of, for example, silicon interleaved with target wafers.

A stream of substantially oxygen-free ambient gas is introduced into one end of the open tube diffusion tube and expelled from the other end to function as a medium to transport aluminum vapor from the source to the target wafer. A rate of flow of at least one to two liters per min. is preferred. In accordance with one aspect of the invention, argon may be utilized as carrier gas at a preferred flow rate of two to three liters per hour.

The features of the invention which are believed to be novel are pointed out with particularity in the appended claims.

The invention itself, however, both as to its organization and method of operation together with further reference to the following description taken in connection with the accompanying drawings in which.

Figure 1:
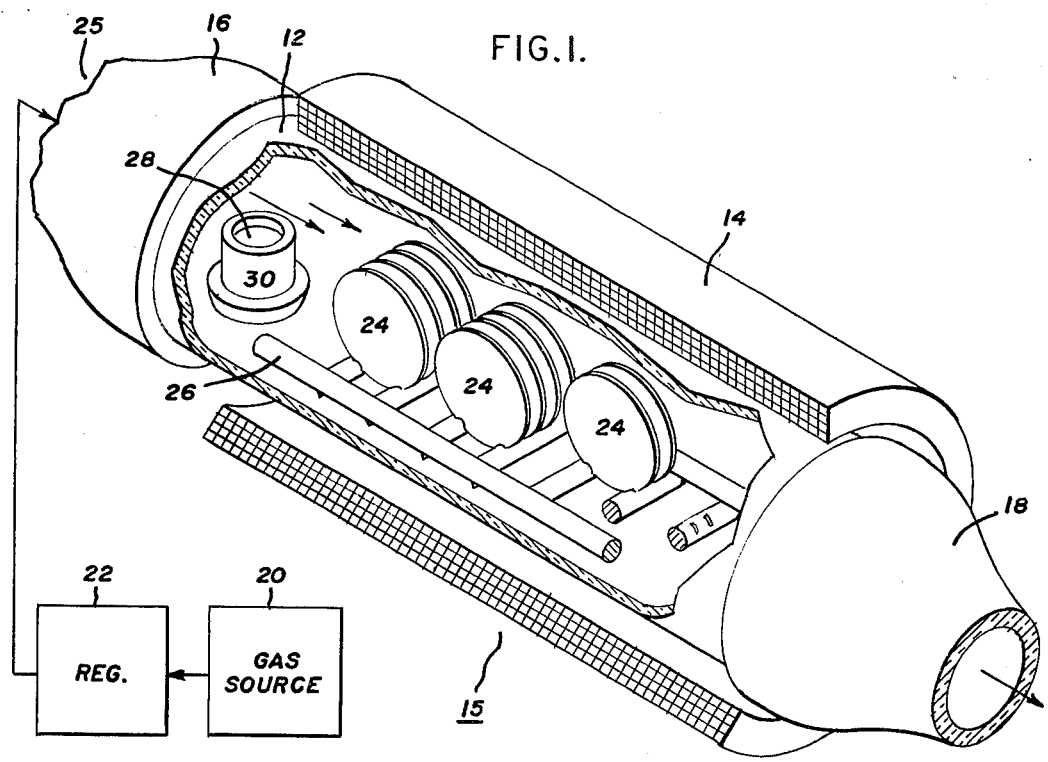
FIG. 1 illustrates apparatus for carrying out the method of this invention.

The method for carrying out this invention may be readily understood by referring now to FIG. 1 wherein apparatus for practicing the invention is illustrated. An envelope 12 which may conveniently be a cylindrical quartz or silicon envelope is disposed within heating means 14. The combination of envelope or tube 12 and heating means 14 makes up a furnace 15 of the type conventionally utilized for carrying out the diffusion process in the semiconductor art ad, as such, forms no particular part of this invention.

Tube 12 includes first and second open ends which are connected to couplers 16 and 18 for connection to gas source 20 and for exhausting gas from the tube, respectively. Couplers 16 and 18 are to be distinguished from similar appearing, sealing couplers in closed tube diffusion apparatus, the purpose of which is to allow the evacuation of a diffusion tube to a low pressure. Couplers 16 and 18 function to provide a continuous stream of a gas, or mixture of gasses, through tube 12 at a preselected flow rate during the heating for carrying out the new diffusion process of this invention. The desired rate of flow of gas through open diffusion tube 12 depends upon the diameter of the tube. For a tube having an inside diameter of about 100 millimeters, a rate of gas flow of at least one liter per minute and preferably two to three liters per minute provides good results. It will be understood that where larger or smaller tubes are used that the rate of flow of gas may be modified to compensate for the variation in tube size.

For providing the required flow of gas or gasses, gas source 20 communicates with inlet port 25 of coupler 16. Regulator 22 may include or be connected to sources of gas for providing each of the constituents of the gas flow as hereinbelow described. Preferably, separate sources of gas and flow regulators are provided for each constituent gas of the flow. In an alternative embodiment of the invention, it may be desirable to provide a single pre-mixed source of gas and a single regulator. The presently preferred embodiment of this invention utilizes a single gas and therefore only a single regulator and gas source are required.

A plurality of semiconductor target wafers 24 to be diffused with aluminum is disposed in a holder or boat 26. Preferably, the wafers are oriented in the boat parallel to the gas flow through tube 12 to allow the gas to carry impurity atoms past the exposed surfaces of the target wafers. The wafers should preferably be spaced apart a sufficient distance to allow for the flow of gas therebetween. It has been found that an inter-wafer spacing of about 9/32 of an inch provides adequate gas flow over the surfaces of the wafers.

A source of impurity atoms 28 is disposed within the tube between the coupler 16 and wafers 24. Conveniently, a source of solid aluminum within a crucible 30 or other container which will both withstand the heat of diffusion and not introduce any undesirable impurities into the gas stream during diffusion should be utilized. While those skilled in the art will undoubtedly be aware of many satisfactory materials, it has been found that a crucible of sapphire is advantageously employed. Sapphire is preferred for its high melting pont and for its degree of purity which permits its use without introducing unwanted impurities into the gas flow during diffusion.

It is preferable to avoid rapid temperature cycling of the wafers. Accordingly, heating means 14 are usually energized to heat tube 12 to the diffusion temperature after the insertion of the wafers therein.

Wafers may be introduced into the elevated temperature portion by placing them in boat 26 and sliding the boat into the tube, for example, by removing coupler 18 from the downstream end of tube 12 and inserting the wafer filled boat into the end of the tube, and replacing coupler 18.

Normally, it is not necessary to replace solid aluminum source 28 after processing of every group of wafers. This provides for very economical processing of relatively large numbers of target wafers. Source 28 normally is replenished when it no longer yields sufficient aluminum vapor to produce the desired impurity concentration in the target wafers.

After a suitable time for diffusion which time depends upon the characteristics of the diffused region which it is desired to form, boat 26 is withdrawn from furnace 15, and after cooling, completed wafers 24 are removed. A new batch of target wafers may now be introduced into the furnace without further attention to the open tube.

In accordance with an exemplary embodiment of this invention, furnace 15 is heated to 1200° C. A flow of substantially pure argon is established at a rate of between 2 and 3 liters/min. in a 100 mm inside diameter tube of quartz or silicon. The presence of oxygen in the gas stream is to be particularly avoided. Silicon wafers of float-zone silicon having a resistivity of about 100 ohm-cm and being of n-conductivity type are introduced into the diffusion tube along with about 20 grams of elemental aluminum. The diffusion process is carried out for about 35 hours. According to the foregoing, a wafer is produced having a p-conductivity-type surface layer having a surface impurity concentration of about $10^{18}$ atoms/cm$^3$ and a depth of about 70 $\mu$m and forming a high quality, high voltage p-n junction with the body of the wafer. The time required to form the same general type of region according to the prior art using, for example, boron as a diffusant would be from three to four times longer; additionally, the characteristics of the junction, especially the capability to withstand a high reverse voltage, would be inferior. While substantially pure argon is used in the exemplary embodiment of this invention hereinabove described, other gasses may also be utilized. In addition to the inert gasses which are otherwise suitable for open tube diffusion as is understood by those skilled in the art, non-strictly inert gasses which do not react with aluminum and which do not introduce undesirable impurities which either react with the semiconductor target wafers or diffuse into the wafers may be employed. Nitrogen has been found to provide good results in accordance with this invention and it will be understood that as used herein, inert means inert with respect to the semiconductor and aluminum, and not necessarily inert with respect to all elements.

Figure 2:
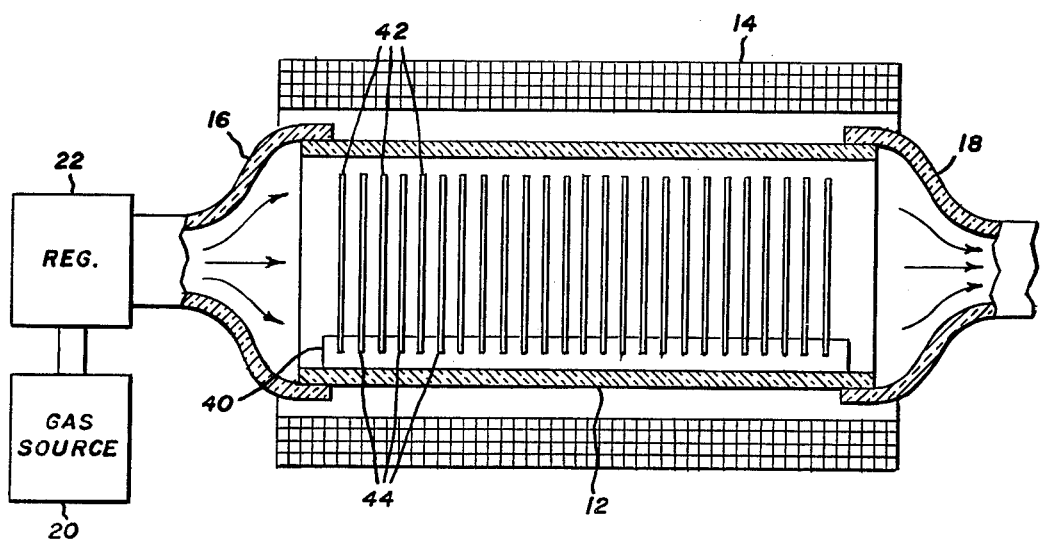
FIG. 2 illustrates apparatus for carrying out an alternative method in accordance with this invention.

Apparatus for carrying out an alternative embodiment of this invention is illustrated at FIG. 2. The apparatus of FIG. 2 is in many respects similar to that of FIG. 1 and therefore like elements are designated therein with like reference numerals. The distinctions between FIG. 1 and FIG. 2 reside in the disposition of the target wafers within tube 12 and the nature of the source of aluminum dopant atoms. Boat 40 carried a plurality of source wafers 42 and a like plurality of target wafers 44. The wafers may be disposed essentially perpendicular to the gas stream within tube 12, and target wafers are spaced from one another and from source wafers by a distance sufficient to insure that gas flow will occur between the several wafers. It has been found that a space of between about 3/16 inches and 15/32 inches provides good results. While a greater number of wafers may be processed at one time using an orientation perpendicular to the gas flow, the hereinabove described orientation of wafers parallel to the gas flow may, of course, also be used. Target wafers 44 are in all respects identical to target wafers 24 of FIG. 1. Source wafers 42 are employed in place of solid aluminum source 28. Source wafers 42 may take any one of a number of forms. Preferably, for minimizing the cost of source wafers 42, they are formed of silicon which contains aluminum. Preferably, the aluminum is added during the formation of the wafers by introducing aluminum to the molten silicon in the melt before the ingot from which wafers 42 are cut is pulled. This method for adding impurity atoms to single crystal silicon is in general well known. Preferably, the amount of aluminum present in source wafers 42 should be sufficient to provide the ultimate impurity concentration of the target wafers after diffusion which is desired. It has been determined that silicon source wafers having a maximum level of aluminum concentration therein in the range of about $10^{18}$–$10^{20}$ atoms/cm$^3$ provide the required amount of aluminum for diffusion in accordance with this invention. Aluminum doped silicon source wafers as described may be utilized repetitively until the aluminum therein is depleted to the extent adequate target wafer surface concentrations cannot be obtained. It is oftentimes desirable after each diffusion process to clean the source wafers in order to continue to achieve surface impurity concentrations equal to those achieved with new source wafers. Generally, etching in hydrochloric acid or aqua regia provides adequate cleaning for the source wafers.

In accordance with another alternative embodiment of this invention, alloyed aluminum source wafers may be provided wherein silicon or other similar base wafers are provided with an alloyed aluminum coating thereon which coating releases aluminum atoms during the open tube aluminum diffusion process of this invention. Alloyed aluminum silicon wafers may be formed by plating aluminum onto the surface of silicon wafers and heating the wafers to a temperature of about 1000° C. to alloy the aluminum and the silicon. Alloyed source wafers provide a source of aluminum which is easily released during the open tube diffusion process of this invention.

In accordance with another alternative embodiment of this invention, source wafers may be utilized which are themselves diffused with aluminum prior to use in an open tube aluminum diffusion process in accordance with this invention. Such diffused source wafers may be formed in accordance with any known method for performing such diffusions.

It is a feature of each of the sources of aluminum hereinabove described, both the elemental source disposed in an inert crucible upstream from the target wafers and the source wafers which are interleaved with the target wafers in alternating disposition in a boat, that they are remote from the target wafers and that there is no necessity for applying a dopant containing material to the surface of the target wafer which process is both time consuming and expensive.

Either of the alternative embodiments of this invention hereinabove discussed is capable of providing ultimate impurity concentrations on the order of between about $10^{18}$ and $10^{19}$ atoms/cm$^3$ in times which are relatively short compared to the times heretofore required for producing similar impurity concentrations utilizing boron or the like. Where it is desired to reduce the surface impurity concentration while nevertheless providing deep diffusion, it is desirable in accordance with this invention to introduce a slight amount of oxygen to an amount of between about zero and about one percent, and preferably, between zero and about 0.5 percent of the gas flow that ultimate surface impurity concentrations may be reduced from about $5 \times 10^{18}$ to about $10^{16}$ atoms/cm$^3$ as the amount of oxygen is increased. This aspect of the instant invention provides a degree of flexibility heretofore unattainable to open or closed tube diffusion processes. Additionally, the ultimate impurity concentration may be varied by varying the concentration of aluminum in the source or source wafers.

Figure 3:
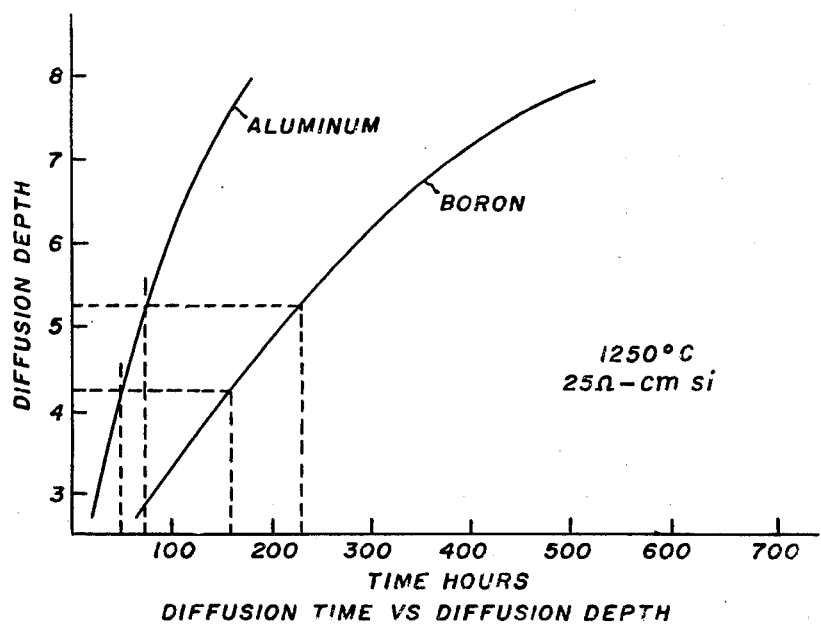

FIG. 3 illustrates graphically the time advantage to be obtained through the use of the method of the instant invention. It will be seen by reference to FIG. 3 that, for example, to form a region in a wafer having a depth of between about 4 and 4.5 mils, a diffusion which would take about 160 hours utilizing boron as a dopant can be accomplished in about 45 hours according to the instant invention. Similarly, a diffusion which will take about 230 hours utilizing boron can be accomplished in about 75 hours. These times are for diffusion from a single surface only, it being understood that diffusions which extend completely through a wafer may be performed from both sides simultaneously in half the time required for a diffusion from a single surface. A substantial time saving is apparent. The instant invention may be especially important where it is desired to provide p-type regions in high power devices of substantial thickness. It will be seen by reference to the graph that to form a diffused region having a thickness of about 7 mils would require in excess of 400 hours in accordance with prior art methods while the instant invention provides a 7 mil diffusion in a time under that heretofore required to form diffusions having thicknesses of about 4 mils.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A method for diffusing aluminum into a silicon semiconductor wafer comprising the steps of:
   disposing said wafer within an open diffusion tube;
   disposing a source of aluminum in said tube, said source being spaced apart from said wafer;
   providing a flow of non-oxidizing inert gas through said tube at a rate in excess of about 1 liter/min.;
   heating said tube to a temperature sufficient to create an aluminum vapor in said tube and to cause aluminum atoms to diffuse into said semiconductor wafer.

2. The method of claim 1 wherein said source of aluminum comprises a reuseable source of aluminum.

3. The method of claim 1 wherein said rate is between about 2 and 3 liters/min.

4. The method of claim 1 wherein said source of aluminum comprises a source of elemental aluminum.

5. The method of claim 1 wherein said source of aluminum is disposed upstream from said wafer.

6. The method of claim 1 wherein a plurality of wafers is diffused simultaneously and, further, wherein said source of aluminum comprises a wafer-shaped source of aluminum comprising disposing said wafers and said wafer-shaped sources in alternating fashion.

7. The method of claim 6 wherein said wafer-shaped source comprises a silicon wafer coated wth aluminum.

8. The method of claim 6 wherein said wafer-shaped source comprises a silicon wafer having aluminum impurities.

9. The method of claim 6 wherein said wafer-shaped source comprises an aluminum alloy source wafer.

10. A method for forming a p-conductivity type region in an n-conductivity type silicon semiconductor wafer comprising:
- disposing said wafer in an open, non sealed diffusion tube;
- establishing a flow of inert gas in said tube, said flow being at a rate sufficient to substantially prevent ambient atmosphere from entering said tube;
- disposing a source of aluminum between said wafer and the source of said gas flow;
- heating said wafer and said source of aluminum within said tube to a temperature sufficient to diffuse aluminum into said wafer.

11. The method of claim 10 wherein said rate of flow is at least 1 liter/min per 100 mm of inside tube diameter.

12. The method of claim 11 wherein said flow of inert gas comprises a flow of gas selected from the group consisting of argon gas and nitrogen gas.

13. The method of claim 11 wherein said source of aluminum comprises a source of elemental aluminum.

14. The method of claim 11 wherein said source of aluminum comprises a wafer-shaped source of aluminum.

15. The method of claim 10 for diffusing a plurality of wafers simultaneously comprising disposing said plurality of wafers alternately with a plurality of wafer-shaped sources of aluminum.

16. The method of claim 10 comprising heating said source and said wafer until a surface impurity concentration in said wafer of at least $10^{17}$ atoms/cm$^3$ is obtained.

17. The method of claim 10 comprising heating said source and said wafer until a surface impurity concentration in said wafer of at least $10^{18}$ atoms/cm$^3$ is obtained.

18. The method of claim 10 comprising heating said source and said wafer until a surface impurity concentration in said wafer of at least $10^{19}$ atoms/cm$^3$ is obtained.

19. The method of claim 10 further comprising at least partially inhibiting said diffusion by introducing oxygen into said flow in an amount between about zero and about 0.5% by volume of said flow.

20. The method of claim 10 wherein said source of aluminum comprises a wafer of semiconductor material doped with aluminum.

21. The method of claim 10 wherein said source of aluminum comprises a wafer of semiconductor material having a layer of aluminum alloyed to a surface thereof.

22. The method of claim 10 wherein said source of aluminum comprises a wafer of semiconductor material having aluminum diffused therein.

23. The method of claim 10 wherein said source of aluminum comprises a substrate wafer having a layer of aluminum plated thereon.

24. The method of claim 23 wherein said substrate wafer is a wafer of semiconductor material.

25. The method of claim 24 wherein said material is silicon.

* * * * *